(12) United States Patent
Roberts et al.

(10) Patent No.: US 9,030,079 B1
(45) Date of Patent: May 12, 2015

(54) ENERGY HARVESTING DEVICE USING AUXETIC MATERIALS

(75) Inventors: M. Joseph Roberts, Ridgecrest, CA (US); Alfred J. Baca, Ridgecrest, CA (US); William W. Lai, Ridgecrest, CA (US); Lawrence C. Baldwin, Ridgecrest, CA (US); Michael T. Owens, Ridgecrest, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 375 days.

(21) Appl. No.: 13/553,744

(22) Filed: Jul. 19, 2012

Related U.S. Application Data

(62) Division of application No. 13/553,638, filed on Jul. 19, 2012.

(60) Provisional application No. 61/607,378, filed on Mar. 6, 2012.

(51) Int. Cl.
*H01L 41/113* (2006.01)
*H02N 2/18* (2006.01)
*F23Q 3/00* (2006.01)

(52) U.S. Cl.
CPC . *H02N 2/18* (2013.01); *F23Q 3/002* (2013.01)

(58) Field of Classification Search
CPC .................................. H02N 2/18; F23Q 3/002
USPC .................................. 310/339, 311; 290/1 A
See application file for complete search history.

(56) References Cited

U.S. PATENT DOCUMENTS

| | | | |
|---|---|---|---|
| 6,433,465 B1 * | 8/2002 | McKnight et al. | 310/339 |
| 7,196,668 B2 * | 3/2007 | Lin et al. | 343/702 |
| 2006/0238066 A1 * | 10/2006 | Pelrine et al. | 310/309 |
| 2006/0238079 A1 * | 10/2006 | Pei et al. | 310/339 |
| 2008/0212262 A1 * | 9/2008 | Micallef | 361/502 |
| 2010/0244457 A1 * | 9/2010 | Bhat et al. | 290/1 A |
| 2011/0148256 A1 * | 6/2011 | Fujimoto | 310/339 |
| 2011/0168313 A1 * | 7/2011 | Ma et al. | 152/302 |

OTHER PUBLICATIONS

English Translation of JP 2008-053527, Shunichi.*
East search results of JP 2008-053527, Shunichi.*

* cited by examiner

*Primary Examiner* — Derek Rosenau
*Assistant Examiner* — Bryan Gordon
(74) *Attorney, Agent, or Firm* — James M. Saunders

(57) ABSTRACT

An energy harvesting device using auxetic materials includes a first auxetic conductive electrode layer. A second auxetic conductive electrode layer is associated with the first auxetic conductive electrode layer. The auxetic conductive electrode layers have negative Poisson ratios. At least one dielectric elastomer layer is associated in layered orientation between the first and second auxetic conductive electrode layers.

7 Claims, 3 Drawing Sheets

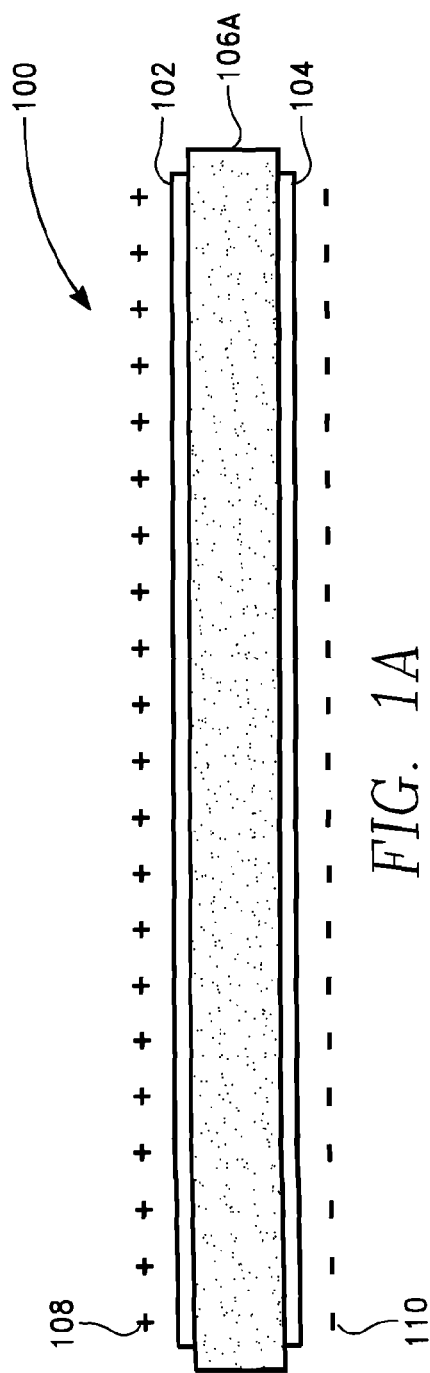
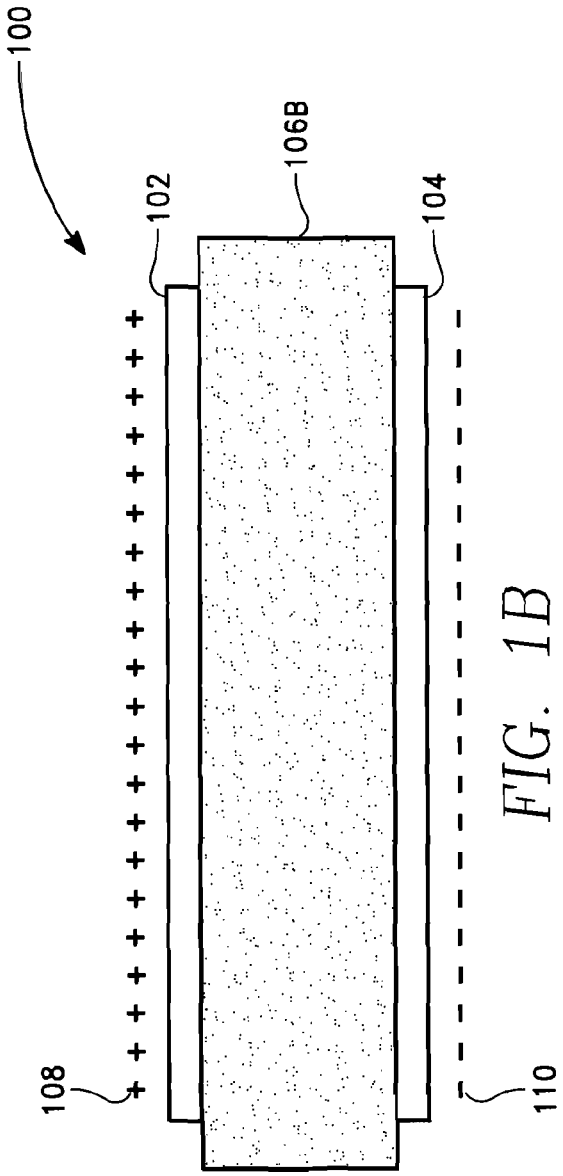

ENERGY HARVESTING DEVICE USING AUXETIC MATERIALS

CROSS-REFERENCE TO RELATED APPLICATIONS

This is a divisional application, claiming the benefit of both parent non-provisional application Ser. No. 13/553,638 filed on Jul. 19, 2012 and parent provisional application No. 61/607,378 filed on Mar. 6, 2012, whereby the entire disclosures of which are incorporated hereby reference.

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

The invention generally relates to energy harvesting, and more particularly, to harvesting the energy of footwear heels striking surfaces during movement.

BRIEF DESCRIPTION OF THE DRAWINGS

FIG. 1A is a side perspective view of a dielectric elastomer generator having a compressed dielectric elastomer layer, according to embodiments of the invention.

FIG. 1B is a side perspective view of a dielectric elastomer generator having a relaxed dielectric elastomer layer, according to embodiments of the invention.

Figure 2A:
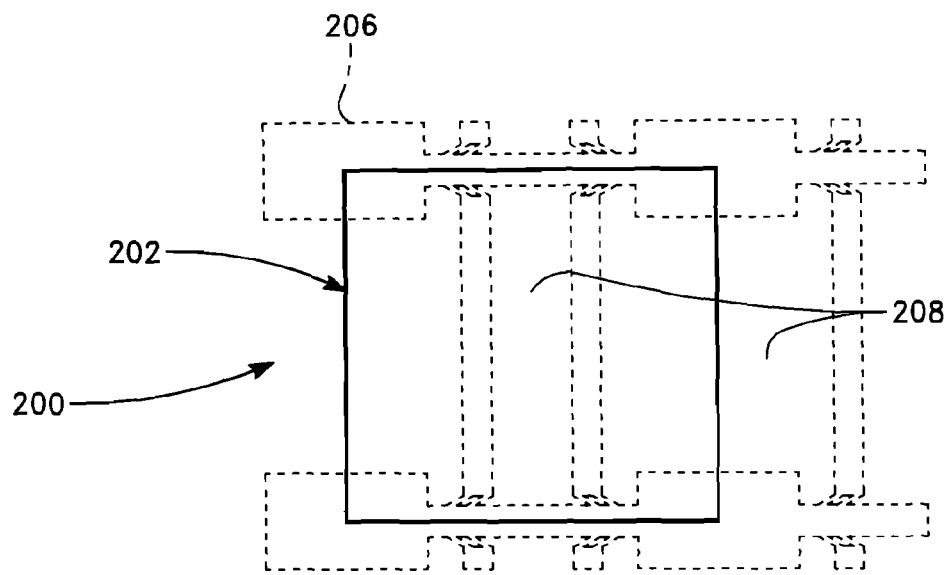
FIG. 2A is a magnified plan view of one auxetic cell within an array of cells, according to embodiments of the invention.

It is to be understood that the foregoing general description and the following detailed description are exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

DETAILED DESCRIPTION OF EMBODIMENTS OF THE INVENTION

The invention generally relates to energy harvesting, and more particularly, to harvesting the energy of footwear heels striking surfaces during movement.

Deployed military personnel carry up to 35 pounds (possibly more) of replacement batteries. There exists a need in the art to reduce the weight of replacement batteries needed.

Embodiments of the invention increase the portion of heel strike energy harvested by utilizing the property of negative Poisson ratio material (also known as auxetic materials). A number of approaches to heel strike energy harvesting are being explored including using piezoelectric materials, dielectric generators, and rotary generators. Embodiments of the invention may be applied to multiple approaches to improve the overall mechanical-to-electrical conversion efficiency.

The human body is a powerhouse. It is estimated that power available from human movements includes 0.3 W from arm motion, 0.4 W from breathing, and 8 W from combined knee, ankle, and foot motion. Examples of ankle motion harvesting exist, however these devices require additional effort which can lead to discomfort and fatigue. Another example is the harvesting of heel strike energy that would otherwise be expended as heat. Embodiments of the invention do not significantly increase the effort required.

Embodiments of the invention improve the performance of shoe heel insert energy harvesting devices by utilizing auxetic metal electrodes in place of spring metal. The auxetic material amplifies the areal change in the piezoelectric layer thus increasing the efficiency. Power is related to areal change in a linear relationship. Greater area change leads to a greater number of electrons pushed out of the system, leading to more power.

In other embodiments of the invention, the dielectric is an auxetic material. The electric current per stroke (heel strike) produced by dielectric generators is proportional to the absolute value of the areal change at the interface between the dielectric and compliant electrodes. The areal change is directly related to the Poisson ratio. Positive Poisson ratio materials have an upper limit of 0.5. Auxetic materials, in particular, polymer foams, commonly have Poisson ratios as low as negative 1.0. Thus, auxetic materials can effect a quadratic improvement in the power harvested with each heel strike. Auxetic materials allow all available lateral space to be more readily utilized. Thus, the auxetic material can be cut to exact dimensions of the available space without concern for interference from the shoe side walls because the auxetic will shrink under the heel strike compression.

Although embodiments of the invention are described in considerable detail, including references to certain versions thereof, other versions are possible. Examples of other versions include orienting the layers in different fashion. Therefore, the spirit and scope of the appended claims should not be limited to the description of versions included herein.

In the accompanying drawings, like reference numbers indicate like elements. FIG. 1A illustrates a side perspective view of a dielectric elastomer generator having a compressed dielectric elastomer layer, according to embodiments of the invention. FIG. 1B is a side perspective view of a dielectric elastomer generator having a relaxed dielectric elastomer layer, according to embodiments of the invention. In both FIGS. 1A and 1B, reference character 100 depicts an apparatus of embodiments of the invention. Materials depicted in FIGS. 1A and 1B represent only one of many example materials that may be used in embodiments of the invention.

As depicted in FIG. 1A, embodiments of the invention generally relate to a dielectric elastomer generator, including a first auxetic conductive electrode layer 102 having a negative Poisson ratio. A second auxetic conductive electrode layer 104 is associated with the first auxetic conductive electrode layer 102. The second auxetic conductive electrode layer 104 has a negative Poisson ratio. At least one dielectric elastomer layer 106A is associated in layered orientation between the first and second auxetic conductive electrode layers 102 and 104. The dielectric elastomer layer 106A is shown in a compressed state in FIG. 1A, while FIG. 1B depicts a dielectric elastomer layer 106B in a relaxed state.

In the compressed state (FIG. 1A), the dielectric elastomer layer 106A possesses low or zero voltage. Charge is applied to the dielectric elastomer layer 106A up to the breakdown voltage of the apparatus 100. In the relaxed state (FIG. 1B), charge is removed from the electrode layers 102 and 104 as the dielectric elastomer layer 106B relaxes at higher voltage.

The first and second auxetic conductive electrode layers 102 and 104 are conductive materials including, but not limited to, metal, carbon nanotubes, and conductive epoxy. The dielectric elastomer 106A include, but is not limited to, materials being rubber and polymeric foam. Material selection is based on application-specific conditions.

The dielectric elastomer layer 106A is bonded to the first and second auxetic conductive electrode layers 102 and 104. The first and second auxetic conductive electrode layers 102 and 104 may be referred to as the top compliant electrode layer and bottom compliant electrode layer without detracting from the merits or generality of embodiments of the invention. Suitable materials for the dielectric elastomer layer 106A in this embodiment include rubber and polymeric foam. For an adaptation of the apparatus 100 using auxetic metal electrodes, compression during heel strike causes the auxetic to shrink in both orthogonal directions with a concomitant greater areal change compared to using a positive Poisson ratio metal.

FIG. 2A illustrates a magnified plan view of one auxetic cell within an array of cells, according to embodiments of the invention. Energy generated is proportional to the energy difference between the compressed and relaxed dielectric. Reference character 200 depicts an apparatus directed to this embodiment.

Referring simultaneously to FIGS. 2A and 1A, another embodiment of the invention relates to a dielectric generator having a first conductive electrode layer 202. A second conductive electrode layer (not shown in FIG. 2A due to figure being in plan view, but depicted in FIG. 1A as reference character 104) is associated with the first conductive electrode layer 202. At least one auxetic dielectric 206 is associated in layered orientation between the first and second conductive electrode layers 202 and 104 (FIG. 1A). The auxetic dielectric 206 has a negative Poisson ratio. To ease with viewing, the first conductive electrode layer 202 is depicted with solid lines and the auxetic dielectric 206 is depicted with dashed lines.

Cells are repeated in a square array to include the complete auxetic dielectric 206. The auxetic dielectric 206 is constructed of an elastic material. Open areas 208 are filled with compressible materials such as, for example, air or other gases. Cells are appropriately-dimensioned based on application-specific conditions. In the embodiments modeled and depicted in FIG. 2A, cell size is approximately 0.5 mm×0.5 mm.

The first and second conductive electrode layers 202 and 104 (FIG. 1A) include, but are not limited to, conductive materials such as, for example, metal, carbon nanotubes, conductive grease, and conductive epoxy. The auxetic dielectric 206 includes, but is not limited to, materials being rubber and polymeric foam. The auxetic dielectric 206 is bonded to the first and second conductive electrode layers 202 and 104 (FIG. 1A).

Referring simultaneously to FIGS. 2A and 1A, another embodiment of the invention relates to a method of making a dielectric generator that involves providing a first conductive electrode layer 202. A second conductive electrode layer (not shown in FIG. 2A due to figure being in plan view, but depicted in FIG. 1A as reference character 104) associated with the first conductive electrode layer 202 is provided. At least one auxetic dielectric 206 is provided and is associated in layered orientation between the first and second conductive electrode layers 202 and 104 (FIG. 1A). The auxetic dielectric 206 has a negative Poisson ratio. The auxetic dielectric 206 is bonded to the first and second conductive electrode layers 202 and 104 (FIG. 1A).

Another embodiment of the invention depicted in FIGS. 2A and 1A, relates to a method of making a heel strike energy harvesting device by providing a dielectric elastomer generator 200 configured to fit inside a shoe. The dielectric elastomer generator 200 has a first conductive electrode layer 202, a second conductive electrode layer (not shown in FIG. 2A due to figure being in plan view, but depicted in FIG. 1A as reference character 104) associated with the first conductive electrode layer, and at least one auxetic dielectric 206. The auxetic dielectric 206 is associated in layered orientation between the first and second conductive electrode layers 202 and 104 (FIG. 1A). The auxetic dielectric 206 has a negative Poisson ratio. At least one electrical charge storage device (not shown) is in electrical communication with the dielectric elastomer generator 200. The dielectric elastomer generator 200 is inserted inside the shoe.

Another embodiment of the invention depicted in FIGS. 2A and 1A, relates to an energy harvesting system, including, a first conductive electrode layer 202. A second conductive electrode layer (not shown in FIG. 2A due to figure being in plan view, but depicted in FIG. 1A as reference character 104) is associated with the first conductive electrode layer 202. The first and second conductive electrode layers 202 and 104 (FIG. 1A) include, but are not limited to, conductive materials such as, for example, metal, carbon nanotubes, conductive grease, and conductive epoxy.

At least one auxetic dielectric 206 is associated in layered orientation between the first and second conductive electrode layers 202 and 104 (FIG. 1A). The auxetic dielectric 206 has a negative Poisson ratio. At least one electrical charge storage device (not shown) is in electrical communication with the dielectric elastomer generator 200.

Figure 2B:
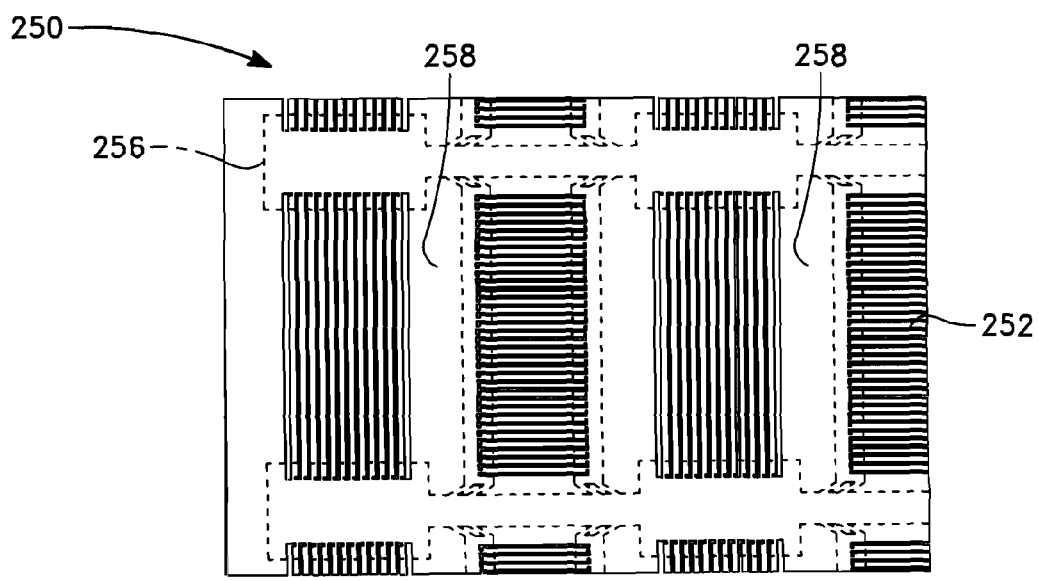
FIG. 2B is a plan view of an auxetic dielectric having piezoelectric material, according to embodiments of the invention.

FIG. 2B illustrates a plan view of an auxetic dielectric having piezoelectric material, according to embodiments of the invention. Energy generated is proportional to the energy difference between the compressed and relaxed dielectric. Reference character 250 depicts an apparatus directed to this embodiment.

Referring simultaneously to FIGS. 2B and 1A, another embodiment of the invention generally relates to a piezoelectric generator, including a first piezoelectric layer 252. A second piezoelectric layer (not shown in FIG. 2A due to figure being in plan view, but depicted in FIG. 1A as reference character 104) is associated with the first piezoelectric layer 252. At least one auxetic dielectric 256 is associated in layered orientation between the first and the second piezoelectric layers 252 and 104 (FIG. 1A). The auxetic dielectric 256 has a negative Poisson ratio. To ease with viewing, the first piezoelectric layer 252 is depicted with solid lines and the auxetic dielectric 256 is depicted with dashed lines.

The first and second piezoelectric layers 252 and 104 (FIG. 1A) include, but are not limited to, piezoelectric materials being ceramics, lead zirconate titanate, and polyvinyldifluoride. The auxetic dielectric 256 includes, but is not limited to, materials being rubber and polymeric foam.

The auxetic dielectric 256 is bonded to the first and second piezoelectric layers 252 and 104 (FIG. 1A). Open areas 258 are filled with compressible materials such as, for example, air or other gases.

An alternative adaptation of the embodiment depicted in FIG. 2B would include using a spring metal. Further research includes developing constructions of alternative embodiments to that shown in FIG. 2B such as, for example, the use of a spring metal in the apparatus 250.

In embodiments, the apparatus 100 (FIG. 1A), 200 (FIG. 2A), and 250 (FIG. 2B) is appropriately-configured and dimensioned to fit within a shoe. In other embodiments, the apparatus 100 (FIG. 1A), 200 (FIG. 2A), and 250 (FIG. 2B) is appropriately-configured and dimensioned to removably fit within a shoe. A shoe heel insert is an example of a removable device.

One having ordinary skill in the art will recognize that the apparatus 100 (FIG. 1A), 200 (FIG. 2A), and 250 (FIG. 2B) can be used with, but is not limited to, a shoe, boot, slipper, or any durable apparel item fitted to a human foot, without detracting from the merits or generality of embodiments of the invention. Furthermore, the concepts embodied herein are equally applicable to other species that can make use of durable wear items fitted to their feet.

One having ordinary skill in the art will also recognize that the apparatus 100 (FIG. 1A), 200 (FIG. 2A), and 250 (FIG. 2B) can be used in, but not limited to, shock absorbers in automobiles, motorcycles, and bicycles, without detracting from the merits or generality of embodiments of the invention.

Similarly, one having ordinary skill in the art will recognize that "at least one" can mean one or higher number. As such, for simplicity, "at least one" is sometimes referred to as "a," "an," or "the" such as, for example, describing "at least one auxetic dielectric" as "an auxetic dielectric" or "the auxetic dielectric" to describe both singular and plural conditions without detracting from the merits or generality of embodiments of the invention.

In embodiments, layers described above as first and second layers bear opposite charges with respect to one another. Thus, the first 102, 202, and 252 (FIGS. 1A, 2A, and 2B, respectively) and second 104 (FIG. 1A) layers bear opposite charges with respect to one another. The opposite charges are depicted as reference characters 108 and 110 in FIG. 1A for all embodiments. Thus, the first and second auxetic conductive electrode layers 102 and 104 (FIG. 1A) bear opposite charges with respect to one another. Similarly, the first and second conductive electrode layers 202 (FIG. 2A) and 104 (FIG. 1A) bear opposite charges with respect to one another. Likewise, the first and second piezoelectric layers 252 (FIG. 2B) and 104 (FIG. 1A) bear opposite charges with respect to one another.

In some embodiments, the negative Poisson ratio of the respective layers includes negative Poisson ratios to about negative 1.0. In other embodiments, the negative Poisson ratio is a range of about negative 0.5 to negative 1.0. Other negative Poisson ratio ranges may also be used based on application-specific conditions without detracting from the merits or generality of embodiments of the invention.

In embodiments, layers are bonded based on application-specific conditions. Suitable bonding includes, but is not limited to, mechanical bonding, chemical bonding, Vanderwals bonding, dipole interaction, and ionic bonding.

In embodiments, energy harvested from the apparatus 100 (FIG. 1A), 200 (FIG. 2A), and 250 (FIG. 2B) can be stored in devices capable of storing electrical charge such as, for example, batteries and capacitors. The devices capable of storing electrical charge are connected such as, for example, by electrically conductive wire to the apparatus 100 (FIG. 1A), 200 (FIG. 2A), and 250 (FIG. 2B). Harvested energy can be used to power low wattage devices such as, for example, mobile phones and radios.

Figure 3:
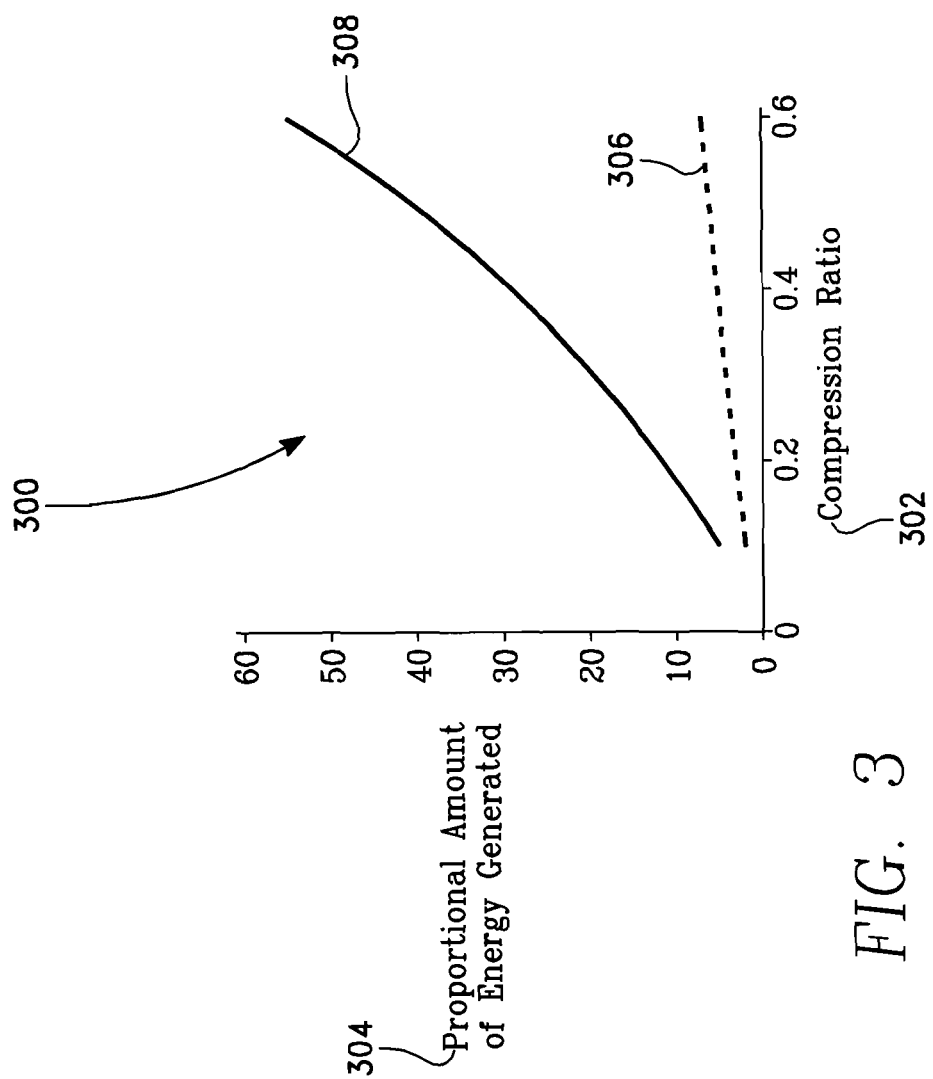
FIG. 3 is a graphical model comparison of the proportional amount of energy generated for positive Poisson ratio materials compared with auxetic materials having Poisson ratios less than negative 0.5, according to embodiments of the invention.

FIG. 3 illustrates a graphical model comparison of the proportional amount of energy generated for positive Poisson ratio materials compared with auxetic materials having Poisson ratios less than negative 0.5, according to embodiments of the invention. The x-axis depicts the compression ratio 302 and the y-axis depicts the proportional amount of energy generated 304. Both x and y axes 302 and 304 quantities are dimensionless. Positive Poisson ratio materials are depicted as the dashed curve 306. Auxetic materials having Poisson ratios less than negative 0.5 are depicted as the solid curve 308.

As shown in FIG. 3, modeling suggests a significant increased energy/output depicted in the auxetic materials having negative Poisson ratios 308 compared with positive Poisson ratio materials 306. Energy is inversely proportional to the area squared. Thus, as the area change increases, the energy generated increases. This relationship accounts for the expected improved energy output for auxetic materials having Poisson ratios less than negative 0.5.

In embodiments, unless specifically claimed and noted, multiple layering orientations are disclosed without detracting from the merits or generality of embodiments of the invention. Likewise, other materials may be used, based on application-specific conditions without detracting from the merits or generality of embodiments of the invention.

In embodiments, layer thicknesses are appropriately-dimensioned as based on application-specific conditions. Thus, for example, layer thicknesses are appropriately-configured and dimensioned based on application-specific conditions. Likewise, layers are substantially-flat although, depending on application-specific conditions, other layer shapes may be used without detracting from the merits or generality of embodiments of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. A method of making a dielectric elastomer generator with auxetic materials, comprising:
   providing a first conductive electrode layer;
   providing a second conductive electrode layer associated with said first conductive electrode layer;
   providing at least one auxetic dielectric layer associated in layered orientation between said first and second conductive electrode layers, wherein said at least one auxetic dielectric layer has a negative Poisson ratio range corresponding to less than negative 0.5 to greater than negative 1.0, mathematically defined as $-1.0 <$ Poisson ratio $< -0.5$, said at least one auxetic dielectric layer having a first side in contact with said first conductive electrode layer and a second side in contact with said second conductive electrode layer, said first and second sides having corresponding surface areas, wherein said corresponding surface areas of said first and second sides of said at least one auxetic dielectric layer experience areal surface changes corresponding to compression and decompression of said at least one auxetic dielectric layer, wherein said at least one auxetic dielectric layer is auxetic rubber; and bonding said at least one auxetic dielectric layer to said first and second conductive electrode layers.

2. The method according to claim 1, wherein said first and second conductive electrode layers are selected from the group of conductive materials consisting of non-auxetic metal, non-auxetic carbon nanotubes, non-auxetic conductive grease, and non-auxetic conductive epoxy.

3. The method according to claim 1, wherein said first and second conductive electrode layers have opposite charges with respect to one another.

4. An energy harvesting system using auxetic materials, comprising:

a first conductive electrode layer;

a second conductive electrode layer associated with said first conductive electrode layer, wherein said first and second conductive electrode layers are selected from the group of conductive materials consisting of metal, carbon nanotubes, conductive grease, and conductive epoxy;

at least one auxetic dielectric layer associated in layered orientation between said first and second conductive electrode layers, wherein said at least one auxetic dielectric layer has a negative Poisson ratio range corresponding to less than negative 0.5 to greater than negative 1.0, mathematically defined as $-1.0 <$ Poisson ratio $<-0.5$, said at least one auxetic dielectric layer having a first side in contact with said first conductive electrode layer and a second side in contact with said second conductive electrode layer, said first and second sides having corresponding surface areas, wherein said corresponding surface areas of said first and second sides of said at least one auxetic dielectric layer experience areas surface changes corresponding to compression and decompression of said at least one auxetic dielectric layer, wherein said at least one auxetic dielectric layer is auxetic rubber; and at least one electrical charge storage device in electrical communication with said first and second conductive electrode layers and said at least one auxetic dielectric layer.

5. The system according to claim 4, wherein said first and second conductive electrode layers have opposite charges with respect to one another.

6. The system according to claim 4, wherein said at least one auxetic dielectric layer is bonded to said first and second conductive electrode layers.

7. The system according to claim 4, wherein said at least one electrical charge storage device is selected from the group of electrical charge storage devices consisting of batteries and capacitors.

* * * * *